(12) United States Patent
Nilsson

(10) Patent No.: US 6,892,057 B2
(45) Date of Patent: May 10, 2005

(54) METHOD AND APPARATUS FOR REDUCING DYNAMIC RANGE OF A POWER AMPLIFIER

(75) Inventor: Magnus Nilsson, Lund (SE)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 451 days.

(21) Appl. No.: 10/215,127

(22) Filed: Aug. 8, 2002

(65) Prior Publication Data

US 2004/0192369 A1 Sep. 30, 2004

(51) Int. Cl.⁷ .............................. H04B 1/04; H04G 3/20
(52) U.S. Cl. .................. 455/126; 455/127.1; 455/108; 455/114.4; 330/129; 330/10
(58) Field of Search .................. 455/126, 127.1–127.4, 455/102, 108, 110, 114.2, 114.3, 115.1, 115.3; 330/127, 129–136, 10, 149, 75, 96

(56) References Cited

U.S. PATENT DOCUMENTS

| | | | | |
|---|---|---|---|---|
| 4,600,892 A | * | 7/1986 | Wagner et al. | 330/144 |
| 5,124,665 A | * | 6/1992 | McGann | 330/149 |
| 5,369,789 A | * | 11/1994 | Kosugi et al. | 455/126 |
| 5,633,893 A | | 5/1997 | Lampe et al. | 375/297 |
| 5,784,412 A | | 7/1998 | Ichihara | 375/302 |
| 5,834,987 A | | 11/1998 | Dent | 332/127 |
| 5,886,573 A | | 3/1999 | Kolanek | 350/10 |
| 6,046,630 A | | 4/2000 | Kim | 329/304 |
| 6,101,224 A | | 8/2000 | Lindoff et al. | 375/300 |
| 6,147,553 A | | 11/2000 | Kolanek | 330/10 |
| 6,160,855 A | | 12/2000 | Nakamura et al. | 375/280 |
| 6,236,267 B1 | | 5/2001 | Anzil | 330/149 |
| 6,373,345 B1 | | 4/2002 | Kimppa et al. | 332/105 |
| 6,633,199 B2 | * | 10/2003 | Nielsen et al. | 330/129 |
| 6,734,724 B1 | * | 5/2004 | Schell et al. | 330/10 |

FOREIGN PATENT DOCUMENTS

| | | |
|---|---|---|
| EP | 0584534 | 3/1994 |
| EP | 1 164 694 A2 | 12/2001 |
| WO | WO 99/07066 | 2/1999 |
| WO | WO 00/35080 | 6/2000 |

OTHER PUBLICATIONS

EP Standard Search Report completed Jul. 7, 2003.
Hajmiri, Ali et al., "Jitter and Phase Noise in Ring Oscillators", IEEE Journal of Solid-State Circuits, vol. 34, No. 6, Jun. 1999 (pp. 790–804).
"TS 25.101 v3.0.0", 3$^{rd}$ Generation Partnership Project (3 GPP), Oct. 1999 (pp. 1–66).

* cited by examiner

Primary Examiner—Duc M. Nguyen
(74) Attorney, Agent, or Firm—Jenkens & Gilchrist, P.C.

(57) ABSTRACT

An output-power threshold is selected such that one or more signal requirements is not outside a pre-determined range when output power of a polar transmitter is less than the output-power threshold. A determination is made whether the output power is less than the threshold. In response to a determination that the output power is less than the threshold, amplitude modulation of a polar signal transmitted by the polar transmitter is disabled. When the output power meets or exceeds the output-power threshold, the polar signal transmitted by the polar transmitter is both amplitude and phase modulated.

26 Claims, 2 Drawing Sheets

METHOD AND APPARATUS FOR REDUCING DYNAMIC RANGE OF A POWER AMPLIFIER

BACKGROUND OF THE INVENTION

1. Technical Field of the Invention

The present invention generally relates to reducing a dynamic range of a power amplifier. In particular, the present invention relates to reducing a dynamic range of a power amplifier used as part of a polar transmitter while still meeting all other transmitter signal requirements.

2. Description of Related Art

Many communication-system standards such as, for example, the Global System for Mobile Communications (GSM), use constant-envelope modulation. In constant-envelope modulation, all modulating information is contained in a phase part of a transmitted signal. As a result, all blocks of a modulator used as part of a GSM transmitter can be run in saturation.

Many newer communication-system standards require linear modulation. Linear modulation is more spectrally-efficient than constant-envelope modulation. Systems based on, for example, Enhanced Data for GSM Evolution (EDGE), Universal Mobile Telecommunications System (UMTS), Wideband Code Division Multiple Access (WCDMA), and Code Division Multiple Access 2000 (CDMA2000) utilize linear modulation. In linear modulation, modulating information is contained in both an amplitude part and a phase part of a transmitted signal. Therefore, all blocks of a transmitter, and especially a power amplifier block of the transmitter, must be run in a linear mode in order to avoid distorting the transmitted signal. Running the blocks in the linear mode causes the power efficiency of the transmitter to drop and results in more noise being generated.

Dividing a modulating signal into the phase part and the amplitude part permits the phase part to be introduced in a phase locked loop (PLL) or an in-phase quadrature (IQ) modulator and the amplitude part to be introduced in a power amplifier positioned after the PLL or IQ modulator. In this way, switching blocks can be used, which results in better power efficiency. If the blocks are run in switching mode, noise is amplified only at instants of switching, which results in less noise.

FIG. 1 shows an exemplary polar transmitter 100 that permits the modulating signal to be divided as discussed above. The polar transmitter 100 includes a PLL modulator 102 that serves as a two-point frequency modulator, a power amplifier (PA) 104, and an antenna 106. A polar signal is divided into a phase part ($f_{inst}(s)$) and an amplitude part (A(s)) and is input to the transmitter 100 as described in detail below. FIG. 1 represents one of several polar-modulation schemes described in U.S. Pat. No. 5,834,987 to Dent, which is incorporated herein by reference.

The phase part of the polar signal is input to a Sigma-Delta modulator 108. The Sigma-Delta modulator 108 outputs control signals, which are fed to a prescalar division block 110. An output of the prescalar division block 110 is fed to a phase frequency detector 112. A PLL reference signal $\theta_{ref}(s)$ is also input to the phase frequency detector 112. Output of the phase frequency detector 112 is fed to a PLL loop filter ($H_{LP}(s)$) 114. The PLL loop filter provides an integration function. Output of the PLL loop filter 114 and a scaled version of the phase part ($f_{inst}(s)/K'vco$) are summed at a sum block 116. Output of the sum block 116 is input to a voltage-controlled-oscillator (VCO) block 118. The voltage-controlled-oscillator block 118 functions as a direct modulation injector. Output of the voltage-controlled oscillator block 118 is fed back to an input of the prescalar division block 110 and also to the power amplifier 104. The amplitude part of the polar signal is input to the power amplifier 104 as well. Output of the power amplifier 104 is fed to the antenna 106 for transmission.

A transmitter such as, for example, the transmitter 100, must fulfill certain standards-based signal requirements in order to achieve a good radio link and also to avoid interfering with other users. For example, UMTS transmitter signal requirements are specified in 3G TS 25.101, 3rd Generation Partnership Project—Technical Specification Group Radio Access Networks: UE radio transmission and reception (FDD) (Release 1999), which has been promulgated by the Third Generation Partnership Project (3GPP). While polar transmitters such as the transmitter 100 can serve as very power-efficient linear modulators, standards-based signal requirements on the transmitter blocks can become quite stringent. For example, the UMTS power-amplifier dynamic-range requirements are especially difficult to meet. Therefore, an apparatus and method for reducing the dynamic range of a power amplifier that eliminates the drawbacks mentioned above and other drawbacks is needed.

SUMMARY OF THE INVENTION

These and other drawbacks are overcome by embodiments of the present invention, which provides an apparatus and method for reducing the dynamic range of a power amplifier. In an embodiment of the present invention, an apparatus includes a modulator and a power amplifier. The modulator is adapted to perform phase modulation of an input signal. The phase modulation yields a phase-modulated input signal. The power amplifier is adapted to perform amplitude modulation of the phase-modulated input signal in response to output power of the apparatus exceeding a pre-determined output-power threshold. The output-power threshold is selected such that at least one signal requirement is not outside a pre-determined range when the output-power threshold is not exceeded.

In another embodiment of the present invention, a method of operating a polar transmitter includes transmitting first information at a first output power greater than an output-power threshold and transmitting second information at a second output power not exceeding the output-power threshold. The first information is amplitude and phase modulated. The second information is only phase modulated. The output-power threshold is selected such that at least one signal requirement is not outside a pre-determined range when the output power does not exceed the output power threshold.

In another embodiment of the present invention, a method of transmitting a polar signal includes selecting an output-power threshold. The output-power threshold is selected such that at least one signal requirement is not outside a pre-determined range when output power is less than the output-power threshold. The method also includes determining whether the output power is less than the threshold and, in response to a determination that the output power is less than the threshold, disabling amplitude modulation of the polar signal.

BRIEF DESCRIPTION OF THE DRAWINGS

A more complete understanding of exemplary embodiments of the present invention can be achieved by reference to the following Detailed Description of Exemplary Embodiments of the Invention when taken in conjunction with the accompanying Drawings, wherein.

DETAILED DESCRIPTION OF EXEMPLARY EMBODIMENTS OF THE INVENTION

Figure 1:
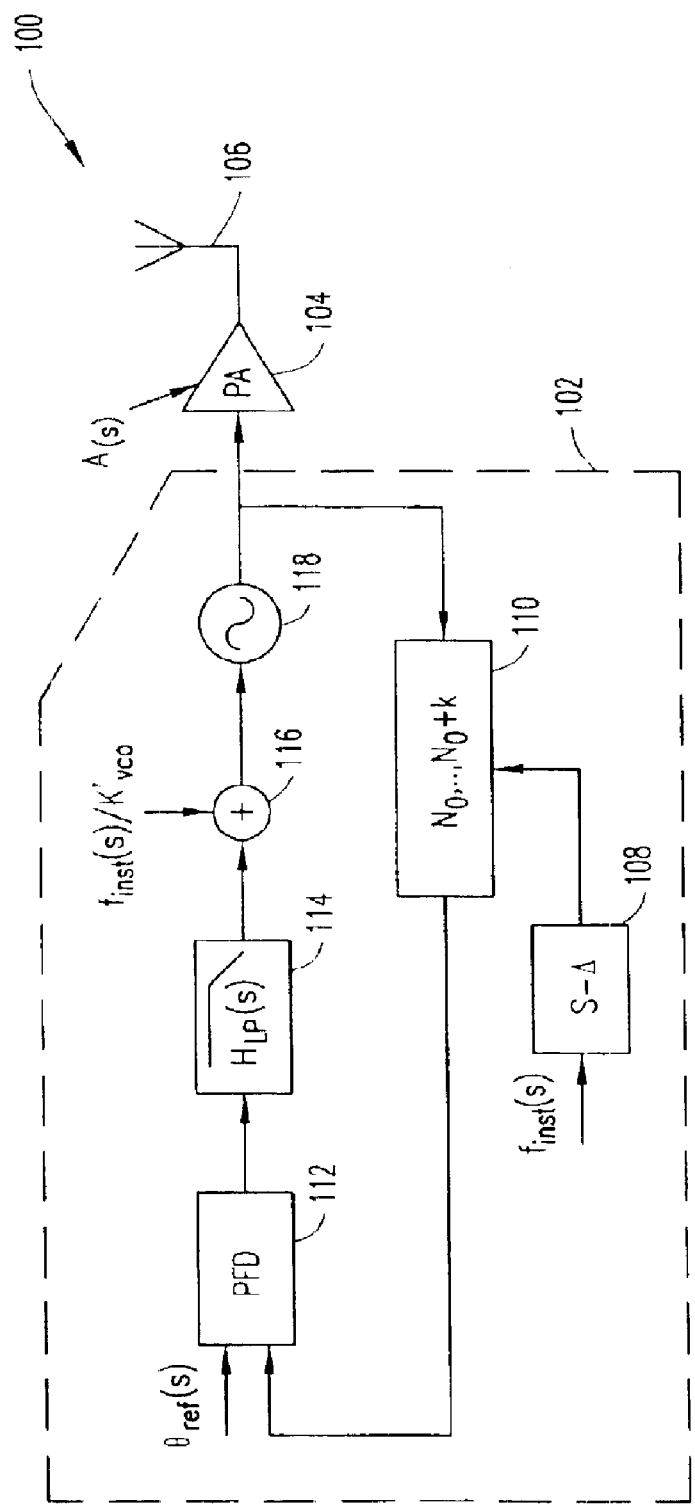
FIG. 1, previously described in part, shows an exemplary polar transmitter 100 that permits a modulating signal to be divided into an amplitude part and a phase part.

In UMTS, the dynamic range of a power amplifier is defined as a range in dB in which all required UMTS specification points (i.e., signal requirements) are met. For example, for a UMTS user equipment (UE) of power class 4, the output power range must be from −50 dBm to 24 dBm (i.e., 74 dB). A UMTS-required modulation depth must then also be added to the output power range to obtain the minimal acceptable dynamic range of the power amplifier.

The modulation depth is defined as a ratio of the maximal and minimal envelope of the transmitted signal. A phase-modulated signal includes no amplitude information; therefore, the modulation depth is 0 dB. An amplitude-modulated (AM) signal has all information stored in the envelope; therefore, the modulation depth is greater than 0 dB and is infinite in the case of a 100% AM signal. The modulation depth is ideally infinite. However, UMTS spectrum-emission-mask signal requirements are the limiting factor in determining a minimal acceptable modulation depth. Simulations have revealed that only an additional 15–20 dB of dynamic range is required in order to achieve sufficient modulation depth to meet the UMTS spectrum-emission-mask signal requirements. To avoid distortion, the power amplifier 104 must pass the modulation depth at all power levels; therefore, the power amplifier 104 dynamic range must be greater than the modulation depth plus the output power range. Thus, the power amplifier 104 must support a dynamic range of at least approximately 90 dB in order to fulfill the UMTS signal requirements.

The 90 dB requirement is very hard to fulfill mainly due to leakage of the phase part through the power amplifier 104. The power amplifier 104 typically has limited isolation from input to output. At low output levels, a signal input to the power amplifier 104 is greater than a signal output by the power amplifier 104 and the minimum output power by the power amplifier 104 is limited by leakage. Because the output power of the power amplifier 104 is a combination of signal leakage from input to output and an amplified signal through the power amplifier 104, if the amplification by the power amplifier 104 is small, the leaking signal tends to dominate the output signal. The power amplifier 104 actually works as an attenuator at very low output power levels. As a lower limit of the dynamic range of the power amplifier 104 is approached, the power amplifier 104 reduces the modulation depth and thereby adds distortion. The dynamic range of the power amplifier 104 is limited at the upper end of the dynamic range by the maximal output power, which in turn is set by the impedance level and supply voltage used.

The UMTS signal requirements include absolute requirements on adjacent-channel leakage ratio (ACLR). ACLR is the ratio of transmitted power to power measured after a receiver filter in adjacent channel(s). Analysis of the absolute requirements of the ACLR reveals that 15–20 dB modulation depth is required only for output-power levels greater than approximately −30 dBm. Therefore, dynamic-range requirements of the power amplifier 104 can be reduced substantially.

Under appropriate conditions, sufficient information can be transmitted in the phase part only of the transmitted signal. In UMTS, the measure of information quality is the signal requirement of error vector magnitude (EVM), which must be less than 17.5%. CDMA systems are inherently immune to error vector magnitude degradation due to the receiver gain when the transmitted signal is despread. If a low error vector magnitude is achieved, a high-quality radio link can be set up.

In simulations of a UMTS system performed by the inventor, a signal was divided into the amplitude part and the phase part, the dynamic range of the amplitude signal was limited, and the amplitude part and the phase part were re-combined. Various simulations are then performed on the re-combined signal. These simulations have shown that detection of the phase part of the transmitted signal by a receiver results in an error vector magnitude of only 11%, which is well below the maximal acceptable error vector magnitude of 17.5%. Therefore, information to be transmitted can be included in only the phase part of the transmitted signal, so long as the output spectrum meets all UMTS signal requirements. For UMTS systems, simulations have demonstrated that, when only the phase part is used, the output spectrum is sufficient and all signal requirements are met for output power levels up to −30 dBm. Thus, for output power levels up to −30 dBm, an amplitude path of the power amplifier 104 can be turned off (i.e., disabled), such that A(s)=0. Since the amplitude path typically includes a digital-to-analog converter (DAC), filters, and other circuitry, substantial power savings can accrue from turning off or disabling the amplitude path.

UMTS signal requirements also mandate that peak2avg be supported at peak output power. For UMTS, peak2avg is approximately 3.4 dB. UMTS defines peak2avg as the ratio of the peak value to the average value of the envelope of the transmitted signal. Thus, when peak2avg support requirements are considered, the dynamic range of the power amplifier 104 is reduced from approximately 90 dB to approximately 57.4 dB (i.e., 54 dB+3.4 dB=57.4 dB).

Even if a full modulation depth of 15–20 dBm is inserted in the amplitude part that is input to the power amplifier 104, at low output-power levels, the effective modulation depth will be lessened due to leakage through the power amplifier 104. For example, if the dynamic range of the power amplifier 104 is 57.4 dB and the power amplifier 104 is transmitting at an output power of −14.0 dBm, 16.0 dB of effective modulation depth remains (i.e., −14.0 dBm−(−30.0 dBm)=16.0 dB).

As the output power of the power amplifier 104 is decreased further below −14.0 dBm, the effective modulation depth is reduced linearly along with the output power. When the output power has been reduced to −30 dBm, the effective modulation depth becomes 0 dB. At this point, the amplitude path of the transmitter 100 can be turned off (i.e., disabled) and swapped to a DC level corresponding to a desired output-power level. As noted above, since the amplitude path includes filters and signal processing (pre-distortion), power savings results therefrom.

Output power control when the amplitude path has been turned off (i.e., disabled) can be attained in at least two ways. First, the power amplifier 104 can be run in a saturated mode and the output power controlled by a voltage for amplitude power control (Vapc). Amplitude power control is achieved by varying the power amplifier 104 bias level, as in a constant-envelope case. Second, the power amplifier 104 can be run in linear mode and a variable gain amplifier (VGA) prior to the power amplifier 104 used to control the output power. In the second case, the power amplifier 104 is biased to avoid saturation and has a constant gain.

Figure 2:
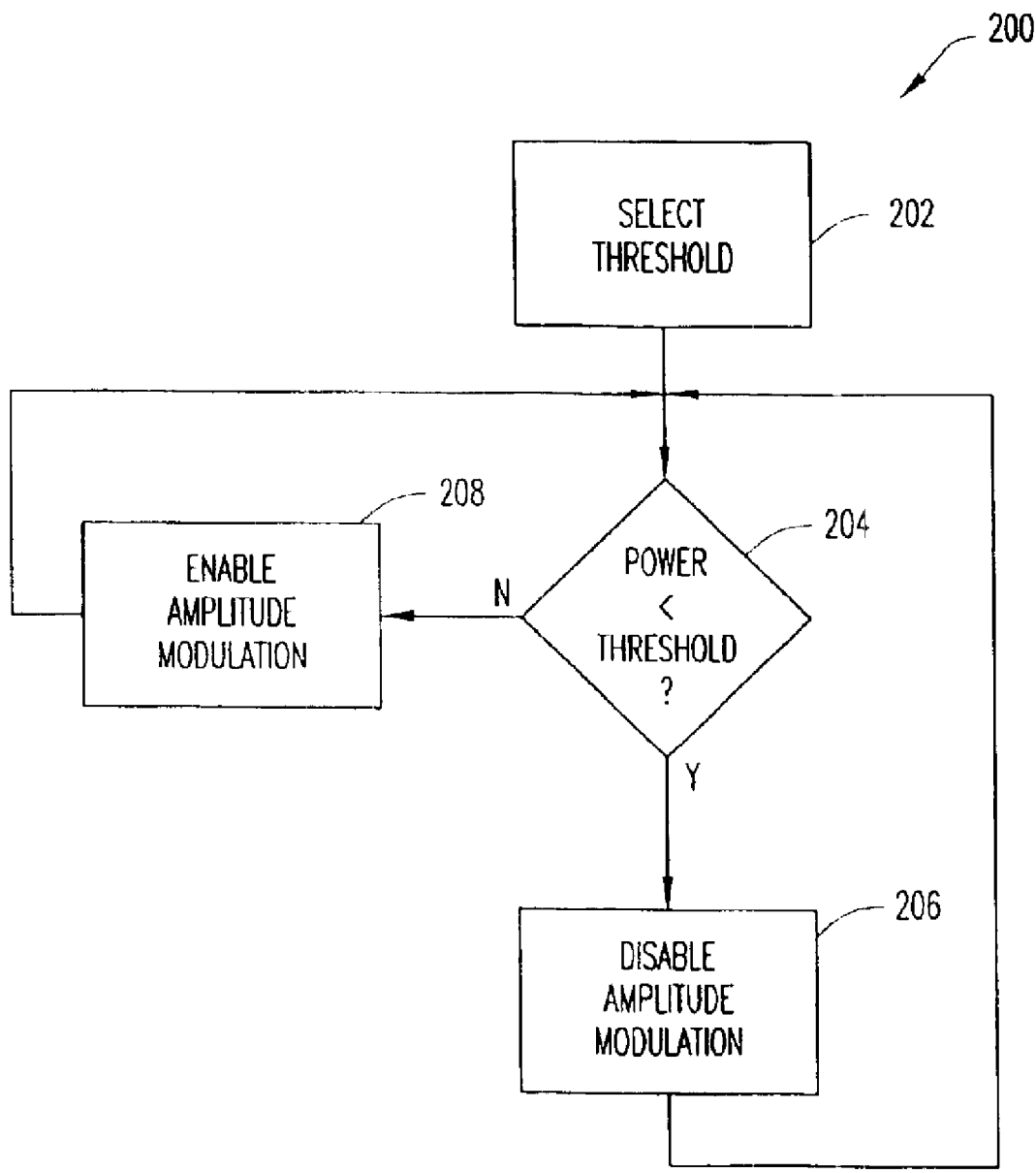
FIG. 2 is a flow chart that illustrates operation of an exemplary embodiment of the present invention.

FIG. 2 is a flow chart that illustrates operation of an exemplary embodiment of the present invention. A flow 200 begins at step 202, at which step an output-power threshold is selected such that at least one signal requirement is not outside a pre-determined range when output power of a polar transmitter, such as, for example, the polar transmitter 100, is less than the output-power threshold. The signal requirements can be, for example, error vector magnitude or adjacent channel leakage ratio. From step 202, execution proceeds to step 204. At step 204, a determination is made whether the output power is less than the output-power threshold. If it is determined at step 204 that the output power is less than the output-power threshold, execution proceeds to step 206.

At step 206, amplitude modulation of the polar signal by the polar transmitter is disabled. As noted above, disabling amplitude modulation by the polar transmitter results in substantial power savings. If, at step 204, it is not determined that the output power is less than the output-power threshold, execution proceeds to step 208. At step 208, amplitude modulation by the polar transmitter is enabled. From both steps 206 and 208, execution proceeds to step 204.

As noted above, the signal requirements will often times include a measure of information quality, such as the error vector magnitude discussed above. In addition, in connection with step 206, a power amplifier of the polar transmitter can be run in a saturated mode and the output power controlled by bearing a biased level of the power amplifier. In the alternative, in connection with step 206, the power amplifier can be run in a linear mode and the output power controlled by a variable gain amplifier.

Application of principles of the present invention yields a substantial reduction in the dynamic power range of the power amplifier 104, lessens problems associated with the phase part leaking through the power amplifier 104 at low power levels, and results in power savings at low output-power levels. While UMTS and the polar transmitter 100 have been used for the exemplary embodiments described herein, the principles of the present invention are not limited to UMTS applications, standards-based signal requirements, or to any particular polar transmitter design.

Although embodiment(s) of the present invention have been illustrated in the accompanying Drawing and described in the foregoing Detailed Description, it will be understood that the present invention is not limited to the embodiment(s) disclosed, but is capable of numerous rearrangements, modifications, and substitutions without departing from the invention defined by the following claims.

What is claimed is:

1. A method of operating a polar transmitter, the method comprising:

transmitting first information at a first output power greater than an output-power threshold, wherein the first information is amplitude and phase modulated;

transmitting second information at a second output power not exceeding the output-power threshold, wherein the second information is only phase modulated; and wherein the output-power threshold is selected such that at least one signal requirement is not outside a pre-determined range when the output power does not exceed the output power threshold.

2. The method of claim 1, wherein the at least one signal requirement comprises an error vector magnitude value.

3. The method of claim 2, wherein the pre-determined range is 0–17.5%.

4. The method of claim 1, wherein the at least one signal requirement comprises an adjacent channel leakage ratio.

5. The method of claim 1, wherein the steps transmitting are performed in the order listed.

6. The method of claim 1, wherein the at least one signal requirement comprises a measure of information quality.

7. The method of claim 1, further comprising, in response to the output power not exceeding the pre-determined output-power threshold, running a power amplifier in a saturated mode and controlling the output power by varying a bias level of the power amplifier.

8. The method of claim 1, further comprising, in response to the output power not exceeding the pre-determined output-power threshold, running a power amplifier in a linear mode and controlling the output power by a variable gain amplifier.

9. The method of claim 1, further comprising:

decreasing the output power toward the output-power threshold;

decreasing an effective modulation depth linearly in relation to the decrease in the output power;

responsive to the output power not exceeding the output-power threshold, performing the step of transmitting the second information.

10. A method of transmitting a polar signal, the method comprising:

selecting an output-power threshold, the output-power threshold being selected such that at least one signal requirement is not outside a pre-determined range when output power is less than the output-power threshold;

determining whether the output power is less than the threshold; and in response to a determination that the output power is less than the threshold, disabling amplitude modulation of the polar signal.

11. The method of claim 10, wherein the at least one signal requirement comprises an error vector magnitude value.

12. The method of claim 11, wherein the pre-determined range is 0–17.5%.

13. The method of claim 10, wherein the at least one signal requirement comprises an adjacent channel leakage ratio.

14. The method of claim 10, further comprising, in response to a determination that the output power is not less than the threshold, enabling amplitude modulation of the polar signal.

15. The method of claim 10, wherein the at least one signal requirement comprises a measure of information quality.

16. The method of claim 10, further comprising, in response to the determination that the output power is less than the pre-determined output-power threshold, running a power amplifier in a saturated mode and controlling the output power by varying a bias level of the power amplifier.

17. The method of claim 10, further comprising, in response to the determination that the output power is less than the pre-determined output-power threshold, running a power amplifier in a linear mode and controlling the output power by a variable gain amplifier.

18. The method of claim 10, further comprising:

decreasing the output power toward the output-power threshold; and decreasing an effective modulation depth linearly in relation to the decrease in the output power.

19. An apparatus comprising:

a modulator, wherein the modulator is adapted to perform phase modulation of an input signal, thereby yielding a phase-modulated input signal;

a power amplifier adapted to perform amplitude modulation of the phase-modulated input signal in response to output power of the apparatus exceeding a pre-determined output-power threshold; and wherein the output-power threshold is selected such that at least one signal requirement is not outside a pre-determined range when the output-power threshold is not exceeded.

20. The apparatus of claim 19, wherein the at least one signal requirement comprises an error vector magnitude value.

21. The apparatus of claim 20, wherein the pre-determined range is 0–17.5%.

22. The apparatus of claim 19, wherein the at least one signal requirement comprises an adjacent channel leakage ratio.

23. The apparatus of claim 19, wherein the at least one signal requirement comprises a measure of information quality.

24. The apparatus of claim 19, wherein, when the output power does not exceed the pre-determined output-power threshold, the power amplifier is run in a saturated mode and the output power is controlled by varying a bias level of the power amplifier.

25. The apparatus of claim 19, wherein, when the output power does not exceed the pre-determined output-power threshold, the power amplifier is run in a linear mode and the output power is controlled by a variable gain amplifier.

26. The apparatus of claim 19, wherein:

when the output power is within a pre-determined range of a lower bound of a dynamic range of the apparatus and is decreased toward the output-power threshold, an effective modulation depth is decreased linearly in relation to the decrease in the output power; and upon the output-power threshold being reached, the power amplifier no longer performs the amplitude modulation.

* * * * *